(12) United States Patent
Solt

(10) Patent No.: US 7,730,341 B1
(45) Date of Patent: Jun. 1, 2010

(54) SYSTEM AND METHOD FOR TRANSITIONING FROM A LOGICAL STATE TO ANY OTHER LOGICAL STATE BY MODIFYING A SINGLE STATE ELEMENT

(75) Inventor: Yosef Solt, Misgav (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 1819 days.

(21) Appl. No.: 10/795,433

(22) Filed: Mar. 9, 2004

Related U.S. Application Data

(60) Provisional application No. 60/460,499, filed on Apr. 4, 2003.

(51) Int. Cl.
*G06F 1/12* (2006.01)
(52) U.S. Cl. ....................................... 713/400; 713/375
(58) Field of Classification Search ................. 713/400, 713/375
See application file for complete search history.

(56) References Cited

U.S. PATENT DOCUMENTS

| | | | |
|---|---|---|---|
| 2,632,058 A | | 3/1953 | Gray |
| 3,753,230 A | * | 8/1973 | Hoffner, II ................... 714/752 |
| 6,006,340 A | | 12/1999 | O'Connell |
| 6,128,749 A | | 10/2000 | McDonnell et al. |
| 6,194,940 B1 | * | 2/2001 | Hunter et al. ................ 327/298 |
| 6,359,479 B1 | | 3/2002 | Oprescu |
| 6,477,609 B1 | | 11/2002 | Reiss et al. |
| 6,523,058 B1 | | 2/2003 | Fung et al. |
| 2001/0038633 A1 | * | 11/2001 | Robertson et al. ........... 370/412 |
| 2003/0072316 A1 | | 4/2003 | Niu et al. |

* cited by examiner

*Primary Examiner*—Tse Chen

(57) ABSTRACT

A system for transitioning from a first logical state to any second logical state of a plurality of logical states includes a first circuit. The first circuit is associated with a first clock domain. The first circuit includes a first state machine. The first state machine includes a plurality of logical states. Each of the plurality of logical states is associated with a plurality of physical states. A single state element in one of the plurality of physical states associated with a first logical state is modified to transition from the first logical state to any second logical state.

84 Claims, 7 Drawing Sheets

SYSTEM AND METHOD FOR TRANSITIONING FROM A LOGICAL STATE TO ANY OTHER LOGICAL STATE BY MODIFYING A SINGLE STATE ELEMENT

This application claims priority under 35 U.S.C. §119(e) to U.S. Provisional Application No. 60/460,499, filed on Apr. 4, 2003, the entire content of which is hereby incorporated herein by reference.

BACKGROUND

1. Field of the Invention

The present invention relates to information communication and processing. More particularly, the present invention relates to a system and method for transitioning from a logical state to any other logical state by modifying a single state element.

2. Background Information

In modern electronic devices, it is often necessary to transfer data between circuits in different digital clock domains. In other words, each circuit may make use of a distinct clock signal to trigger operations in the respective circuit. With different clock domains, the synchronization of data transferred over a bus between the two clock domains becomes problematic. The solution of simply synchronizing all of the information is insufficient. Several bits might change at a single cycle, such as, for example, transitioning from 7 (0111) to 8 (1000). Due to different signal delays, different propagation timings, and the like, a bad temporary value can be spuriously and transiently sampled (e.g., 6 (0110), 14 (1110) and/or 10 (1010)), resulting in incorrect readings.

A partial solution to the problem can be to ensure that only one bit changes between two contiguous logical states, such as, for example, by using a Gray code. A Gray code is an ordering of $2^N$ binary numbers such that only one bit changes from one entry to the next. Gray codes are disclosed in U.S. Pat. No. 2,632,058 to Frank Gray. However, Gray codes can only handle transitions between two contiguous logical states. For a counter, this is equivalent to a move of +1, −1 or 0. Using the example of a Gray code for two bits, if logical state A is represented as 00, logical state B as 01, logical state C as 11, and logical state D as 10, then transitions from A to B to C to D to A are supported, as only one bit is changed during each contiguous transition. However, a single transition from A to C or from B to D is not supported, as each such transition requires more than one bit to change in one cycle.

Several conventional handshake protocols can also be used to address the issue of synchronization of data transfer and allow multiple bits to be changed. However, these handshake protocols do not transfer multiple bits at every cycle, and generally require several cycles for every data transfer. In addition, these handshake protocols fail to address other issues, such as free-running state machines and counters that can be incremented or decremented by any value. Thus, synchronizing data transfers using these handshake protocols on a free-running interface without an additional delay becomes problematic.

Transferring several bits over a bus every cycle may be done with a Gray code, assuming that only a single bit is changed at every cycle. Thus, the sample side can load a new value at every cycle. However, as discussed previously, the conventional implementation of Gray codes is limited to two moves from each state (i.e., a move from a given state to one of the two states that are contiguous to the given state). Gray codes do not support a transition from the given state to another state that is not contiguous to the given state.

SUMMARY OF THE INVENTION

A method and system are disclosed for transitioning from a logical state to any other logical state by modifying a single state element. In accordance with exemplary embodiments, according to a first aspect of the present invention, a system for communicating information includes a first circuit. The first circuit is associated with a first clock domain. The first circuit includes a first state machine. The first state machine comprises a plurality of logical states. Each of the plurality of logical states is associated with a plurality of physical states. A single state element in one of the plurality of physical states associated with a first logical state is modified to transition from the first logical state to any second logical state. Each of the plurality of physical states includes of a plurality of state rings. Each of the plurality of state rings is comprised of at least one state element. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state. According to an exemplary embodiment of the first aspect, each of the plurality of state rings comprises a Gray code.

According to the first aspect, the system includes a second circuit in communication with the first circuit. The second circuit is in communication with the first circuit via, for example, a multi-bit communication bus. The second circuit is associated with a second clock domain. The second circuit includes a second state machine. The second state machine comprises the plurality of logical states. Each of the plurality of logical states is associated with the plurality of physical states. Each of the first and second circuits comprises a communication circuit for communicating the transition from the first logical state to the second logical state between the first state machine and the second state machine. The communication circuit of each of the first and second circuits includes an encoder/decoder. Each encoder/decoder is configured to translate between a physical state of the plurality of physical states and an associated logical state of the plurality of logical states. The system includes a synchronizer in communication with the first circuit and the second circuit. According to an exemplary embodiment of the first aspect, the first clock domain and the second clock domain are different clock domains. Additionally, an Ethernet controller can comprise the system.

According to a second aspect of the present invention, an Ethernet controller includes a state machine. The state machine includes a plurality of logical states. Each of the plurality of logical states is associated with a plurality of physical states. The state machine is configured to modify a single state element in one of the plurality of physical states associated with a first logical state to transition from the first logical state to any second logical state. The system includes circuit logic for translating between a physical state of the plurality of physical states and an associated logical state of the plurality of logical states. The circuit logic includes a communication circuit for communicating the transition from the first logical state to the second logical state.

According to the second aspect, each of the plurality of physical states includes of a plurality of state rings. Each of the plurality of state rings is comprised of at least one state element. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state. According to an exemplary embodiment of the second aspect, each of the plurality of state rings comprises a Gray code.

According to a third aspect of the present invention, a data interface for transferring information between circuits operating in distinct clock domains includes a first state machine. The first state machine is associated with a first clock domain. The data interface includes a second state machine. The second state machine is associated with a second clock domain. Each of the first and second state machines includes a plurality, of logical states. Each of the plurality of logical states is associated with a plurality of physical states. Each of the first and second state machines is configured to modify a single state element in one of the plurality of physical states associated with a first logical state to transition from the first logical state to any second logical state. The data interface includes a communication interface. The first state machine is in communication with the second state machine via the communication interface. The data interface also includes a communication circuit for communicating the transition from the first logical state to the second logical state between the first state machine and the second state machine.

According to the third aspect, each of the plurality of physical states includes of a plurality of state rings. Each of the plurality of state rings is comprised of at least one state element. According to an exemplary embodiment of the third aspect, each of the plurality of state rings comprises a Gray code. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state.

According to the third aspect, the communication circuit includes an encoder/decoder configured to translate between a physical state of the plurality of physical states and an associated logical state of the plurality of logical states. For example, the communication interface comprises a multi-bit communication bus. The communication interface includes a synchronizer for synchronizing communication of the transition from the first logical state to the second logical state between the first state machine and the second state machine. According to an exemplary embodiment of the third aspect, the first clock domain and the second clock domain are different clock domains.

According to a fourth aspect of the present invention, a system for communicating information includes a first circuit means. The first circuit means is associated with a first clock domain. The first circuit means includes a first means for managing logical states. The first means for managing logical states comprises a plurality of logical states. Each of the plurality of logical states is associated with a plurality of physical states. The first means for managing logical states is configured to modify a single state element in one of the plurality of physical states associated with a first logical state to transition from the first logical state to any second logical state. Each of the plurality of physical states includes of a plurality of state rings. Each of the plurality of state rings is comprised of at least one state element. According to an exemplary embodiment of the fourth aspect, each of the plurality of state rings comprises a Gray code. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state.

According to the fourth aspect, the system includes a second circuit means in communication with the first circuit means. For example, the second circuit means is in communication with the first circuit means via a multi-bit communication bus means. The second circuit means is associated with a second clock domain. The second circuit means includes a second means for managing logical states. The first means for managing logical states comprises the plurality, of logical states. Each of the plurality of logical states is associated with the plurality of physical states. Each of the first and second circuit means comprises means for communicating the transition from the first logical state to the second logical state between the first means for managing logical states and the second means for managing logical states. The means for communicating of each of the first and second circuit means includes a means for encoding/decoding. Each means for encoding/decoding is configured to translate between a physical state of the plurality of physical states and an associated logical state of the plurality of logical states. The system includes means for synchronizing communication between the first circuit means and the second circuit means. The means for synchronizing is in communication with the first circuit means and the second circuit means. According to an exemplary embodiment of the fourth aspect, the first clock domain and the second clock domain are different clock domains. Additionally, an Ethernet controller can comprise the system.

According to a fifth aspect of the present invention, an Ethernet controller includes means for managing logical states. The means for managing logical states includes a plurality of logical states. Each of the plurality of logical states is associated with a plurality of physical states. The means for managing logical states is configured to modify a single state element in one of the plurality of physical states associated with a first logical state to transition from the first logical state to any second logical state. The Ethernet controller includes means for translating between a physical state of the plurality of physical states and an associated logical state of the plurality of logical states. Each of the plurality of physical states includes of a plurality of state rings. Each of the plurality of state rings is comprised of at least one state element. According to an exemplary embodiment of the fifth aspect, each of the plurality of state rings comprises a Gray code. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state.

According to a sixth aspect of the present invention, a system for transferring data between circuits operating in distinct clock domains includes a first means for managing logical states and a second means for managing logical states. Each of the first and second means for managing logical states includes a plurality of logical states. Each of the plurality of logical states is associated with a plurality of physical states. Each of the first and second means for managing logical states is configured to modify a single state element in one of the plurality of physical states associated with a first logical state to transition from the first logical state to any second logical state. The system includes means for transferring information. The first means for managing logical states is in communication with the second means for managing logical states via the means for transferring information. The system includes means for communicating a transition from the first logical state to the second logical state between the first means for managing logical states and the second means for managing logical states.

According to the sixth aspect, each of the plurality of physical states includes of a plurality of state rings. Each of the plurality of state rings is comprised of at least one state element. According to an exemplary embodiment of the sixth aspect, each of the plurality of state rings comprises a Gray code. Each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state.

According to the sixth aspect, the means for communicating a transition includes means for translating between a physical state of the plurality of physical states and an associated logical state of the plurality of logical states. The means for transferring information includes means for synchronizing communication of the transition from the first logical state to the second logical state between the first means for managing states and the second means for managing states. The first means for managing states is associated with a first clock domain and the second means for managing states is associated with a second clock domain. According to an exemplary embodiment of the sixth aspect, the first clock domain and the second clock domain are different clock domains.

According to a seventh aspect of the present invention, a method of communicating information includes the steps of: i.) transitioning from a first logical state to any second logical state of a plurality of logical states by modifying a single state element in one of a plurality of physical states associated with the first logical state; and ii.) communicating the transition from the first logical state to the second logical state between a first state machine and a second state machine. The step of transitioning comprises the steps of: iii.) providing the plurality of logical states for each of the first and second state machines; and iv.) associating a plurality of physical states with each of the plurality of logical states. Each of the plurality of physical states includes of a plurality of state rings. Each of the plurality of state rings is comprised of at least one state element. According to an exemplary embodiment of the seventh aspect, each of the plurality of state rings comprises a Gray code. Each state ring of the plurality of state rings is associated with a logical distance between logical states. Each physical state of the plurality of physical states is comprised of a plurality of bits of information. Each of the at least one state element of each of the plurality of state rings comprises a single bit of the plurality of bits of information of each physical state of the plurality of physical states.

According to the seventh aspect, the step of transitioning comprises the step of: v.) modifying the single state element of the one of the plurality of physical states associated with the first logical state in a state ring associated with the logical distance for transitioning to the second logical state. The step of communicating comprises the steps of: vi.) translating between a physical state of the plurality of physical states and an associated logical state of the plurality of logical states; vii.) synchronizing communication between the first state machine and the second state machine; viii.) and communicating between the first state machine and the second state machine via a communication bus. The first state machine is associated with a first clock domain and the second state machine is associate with a second clock domain. According to an exemplary embodiment of the seventh aspect, the first clock domain and the second clock domain are different clock domains.

According to an eighth aspect of the present invention, a method for transitioning from a first logical state to any second logical state of a plurality of logical states comprises the steps of: i.) providing the plurality of logical states for a state machine; ii.) associating a plurality of physical states with each of the plurality of logical states; and iii.) modifying a single state element in one of the plurality of physical states associated with the first logical state to transition from the first logical state to any second logical state. Each of the plurality of physical states includes of a plurality of state rings. Each of the plurality of state rings is comprised of at least one state element. Each state ring of the plurality of state rings is associated with a logical distance between logical states. According to an exemplary embodiment of the eighth aspect, each of the plurality of state rings comprises a Gray code. Each physical state of the plurality of physical states is comprised of a plurality of bits of information. Each of the at least one state element of each of the plurality of state rings comprises a single bit of the plurality of bits of information of each physical state of the plurality of physical states.

According to the eighth aspect, the step of modifying comprises the steps of: iv.) modifying the single state element of the one of the plurality of physical states associated with the first logical state in a state ring associated with the logical distance for transitioning to the second logical state; and v.) translating between a physical state of the plurality of physical states and an associated logical state of the plurality of logical states.

According to a ninth aspect of the present invention, a computer program for communicating information performs the steps of: i.) transitioning from a first logical state to any second logical state of a plurality of logical states by modifying a single state element in one of a plurality of physical states associated with the first logical state; and ii.) communicating the transition from the first logical state to the second logical state between a first state machine and a second state machine. For the step of transitioning, the computer program performs the steps of: iii.) providing the plurality of logical states for each of the first and second state machines; iv.) associating a plurality of physical states with each of the plurality of logical states; and v.) modifying the single state element of the one of the plurality of physical states associated with the first logical state in a state ring associated with the logical distance for transitioning to the second logical state. For the step of communicating, the computer program performs the step of: vi.) translating between a physical state of the plurality of physical states and an associated logical state of the plurality of logical states; vii.) synchronizing communication between the first state machine and the second state machine; and viii.) communicating between the first state machine and the second state machine via a communication bus.

According to the ninth aspect, each of the plurality of physical states includes of a plurality of state rings. Each of the plurality of state rings is comprised of at least one state element. According to an exemplary embodiment of the ninth aspect, each of the plurality of state rings comprises a Gray code. Each state ring of the plurality of state rings is associated with a logical distance between logical states. Each physical state of the plurality of physical states is comprised of a plurality of bits of information. Each of the at least one state element of each of the plurality of state rings comprises a single bit of the plurality of bits of information of each physical state of the plurality of physical states. The first state machine is associated with a first clock domain and the second state machine is associate with a second clock domain. According to an exemplary embodiment of the ninth aspect, the first clock domain and the second clock domain are different clock domains.

According to a tenth aspect of the present invention, a computer program for transitioning from a first logical state to any second logical state of a plurality of logical states performs the steps of: i.) providing the plurality of logical states for a state machine; ii.) associating a plurality of physical states with each of the plurality of logical states; and iii.) modifying a single state element in one of the plurality of physical states associated with the first logical state to transition from the first logical state to any second logical state. For the step of modifying, the computer program performs the step of: iv.) modifying the single state element of the one of the plurality of physical states associated with the first logical state in a state ring associated with the logical distance for transitioning to the second logical state; and v.) translating between a physical state of the plurality of physical states and an associated logical state of the plurality of logical states.

According to the tenth aspect, each of the plurality of physical states includes of a plurality of state rings. Each of the plurality of state rings is comprised of at least one state element. According to an exemplary embodiment of the tenth aspect, each of the plurality of state rings comprises a Gray code. Each state ring of the plurality of state rings is associated with a logical distance between logical states. Each physical state of the plurality of physical states is comprised of a plurality of bits of information. Each of the at least one state element of each of the plurality of state rings comprises a single bit of the plurality of bits of information of each physical state of the plurality of physical states.

According to an eleventh aspect of the present invention, a system for communicating information comprises a first circuit. The first circuit is associated with a first clock domain. The first circuit includes a first state machine. The first state machine comprises a plurality of logical states. Each of the plurality of logical states is associated with a plurality of physical states. The system includes a second circuit in communication with the first circuit. The second circuit is associated with a second clock domain. According to an exemplary embodiment of the eleventh aspect, the first clock domain and the second clock domain are different clock domains. The second circuit includes a second state machine. The second state machine comprises the plurality of logical states. Each of the plurality of logical states is associated with the plurality of physical states. Each of the plurality of physical states includes of a plurality of state rings. Each of the plurality of state rings is comprised of at least one state element. Each of the plurality of state rings comprises a Gray code. A single state element in one of the plurality of physical states associated with a first logical state is modified to transition from the first logical state to any second logical state. The system includes a communication circuit. The communication circuit is configured to communicate the transition from the first logical state to the second logical state between the first state machine and the second state machine. The communication circuit comprises an encoder/decoder. The encoder/decoder is configured to translate between a physical state of the plurality of physical states and an associated logical state of the plurality of logical states.

According to the eleventh aspect, each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state. The system includes a synchronizer in communication with the first circuit and the second circuit. The second circuit is in communication with the first circuit via a multi-bit communication bus.

According to a twelfth aspect of the present invention, a system for communicating information includes a first circuit means. The first circuit means is associated with a first clock domain. The first circuit means includes a first state machine means. The first state machine means includes a plurality of logical states. Each of the plurality of logical states is associated with a plurality of physical states. The system includes a second circuit means in communication with the first circuit means. The second circuit means is associated with a second clock domain. The first clock domain and the second clock domain are different clock domains. The second circuit means includes a second state machine means. The second state machine means includes the plurality of logical states. Each of the plurality of logical states is associated with the plurality of physical states. Each of the plurality of physical states includes of a plurality of state rings. Each of the plurality of state rings is comprised of at least one state element. Each of the plurality of state rings comprises a Gray code. A single state element in one of the plurality of physical states associated with a first logical state is modified to transition from the first logical state to any second logical state. The system includes a communication circuit means. The communication circuit means is configured to communicate the transition from the first logical state to the second logical state between the first state machine means and the second state machine means. The communication circuit means includes an encoder/decoder means. The encoder/decoder means is configured to translate between a physical state of the plurality of physical states and an associated logical state of the plurality of logical states.

According to the twelfth aspect, each state ring of the plurality of state rings is associated with a logical distance between logical states. The single state element of the one of the plurality of physical states associated with the first logical state is modified in a state ring associated with the logical distance for transitioning to the second logical state. Each physical state of the plurality of physical states is comprised of a plurality of bits of information. Each of the at least one state element of each of the plurality of state rings comprises a single bit of the plurality of bits of information of each physical state. The system includes a synchronizer means in communication with the first circuit means and the second circuit means. The second circuit means is in communication with the first circuit means via a multi-bit communication bus means.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a system and method for transitioning from a logical state to any other logical state by modifying a single state element. According to exemplary embodiments, a state machine transitions from any logical state to any other logical state in a single move by modifying only a single bit. Each logical state is represented by multiple associated physical states of the state machine. Each physical state is comprised of sets of state rings. For example, for a state machine with N states, each physical state of each logical state of the state machine has $N/2$ dedicated state rings. Each state ring P (P=1, 2, 3, ..., N/2) is comprised of one or more bits (i.e., state elements) that support a transition of $\pm P$ within the state ring to any other logical state. Each state ring is comprised of Gray codes. As each state ring is decoded as a Gray code, within state ring P the move of $\pm P$ is allowed. Thus, from any current logical state, a move of $\pm 1, \pm 2, \pm 3, \ldots, \pm N/2$ is supported by modifying only a single bit of the proper state ring of the physical state. In other words, if the state machine is to transition between logical states by moves of $\pm 1, \pm 2, \pm 3, \ldots, \pm N/2$, all other bits of the associated physical state remain unchanged, except for the single bit in the proper state ring (e.g., state ring 1 for a move of $\pm 1$, state ring 2 for a move of $\pm 2, \ldots$, or state ring N/2 for a move of $\pm N/2$). For example, to transition from a given logical state to another logical state requiring a move of $\pm 2$, the state machine transitions by changing one bit of state ring 2 within the physical state of the given logical state.

Figure 1:
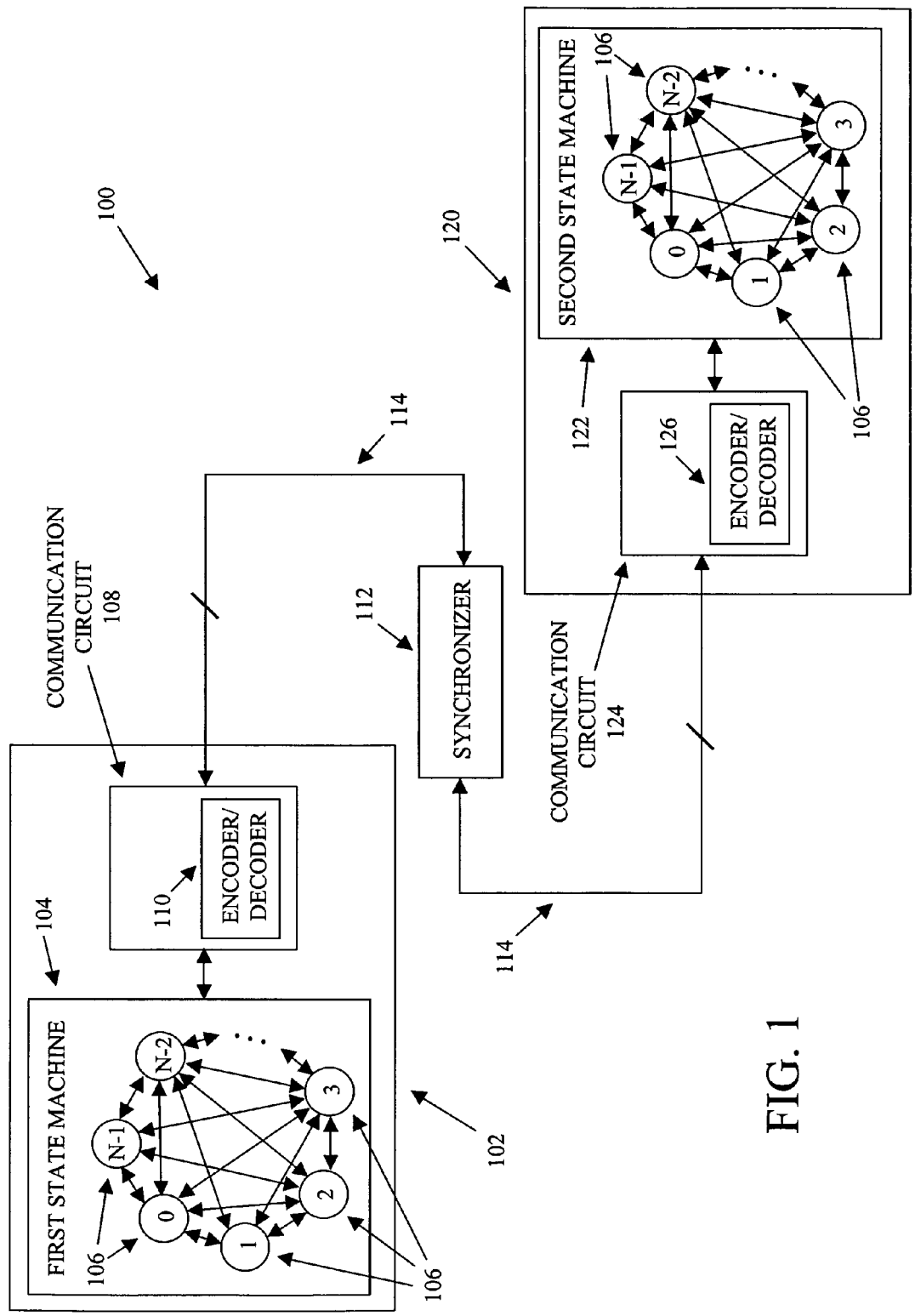
FIG. 1 is a block diagram illustrating a system for communicating information, in accordance with an exemplary embodiment of the present invention.

These and other aspects of the present invention will now be described in greater detail. FIG. 1 is a block diagram illustrating a system 100 for communicating information, in accordance with an exemplary embodiment of the present invention. System 100 includes a first circuit 102. The first circuit 102 is associated with a first clock domain. The first circuit 102 includes a first state machine 104. The first state machine 104 includes a plurality of logical states 106. Each of the plurality of logical states 106 is associated with a plurality of physical states. According to exemplary embodiments, a single state element in one of the plurality of physical states associated with a first logical state is modified to transition from the first logical state to any second logical state.

Figure 2:
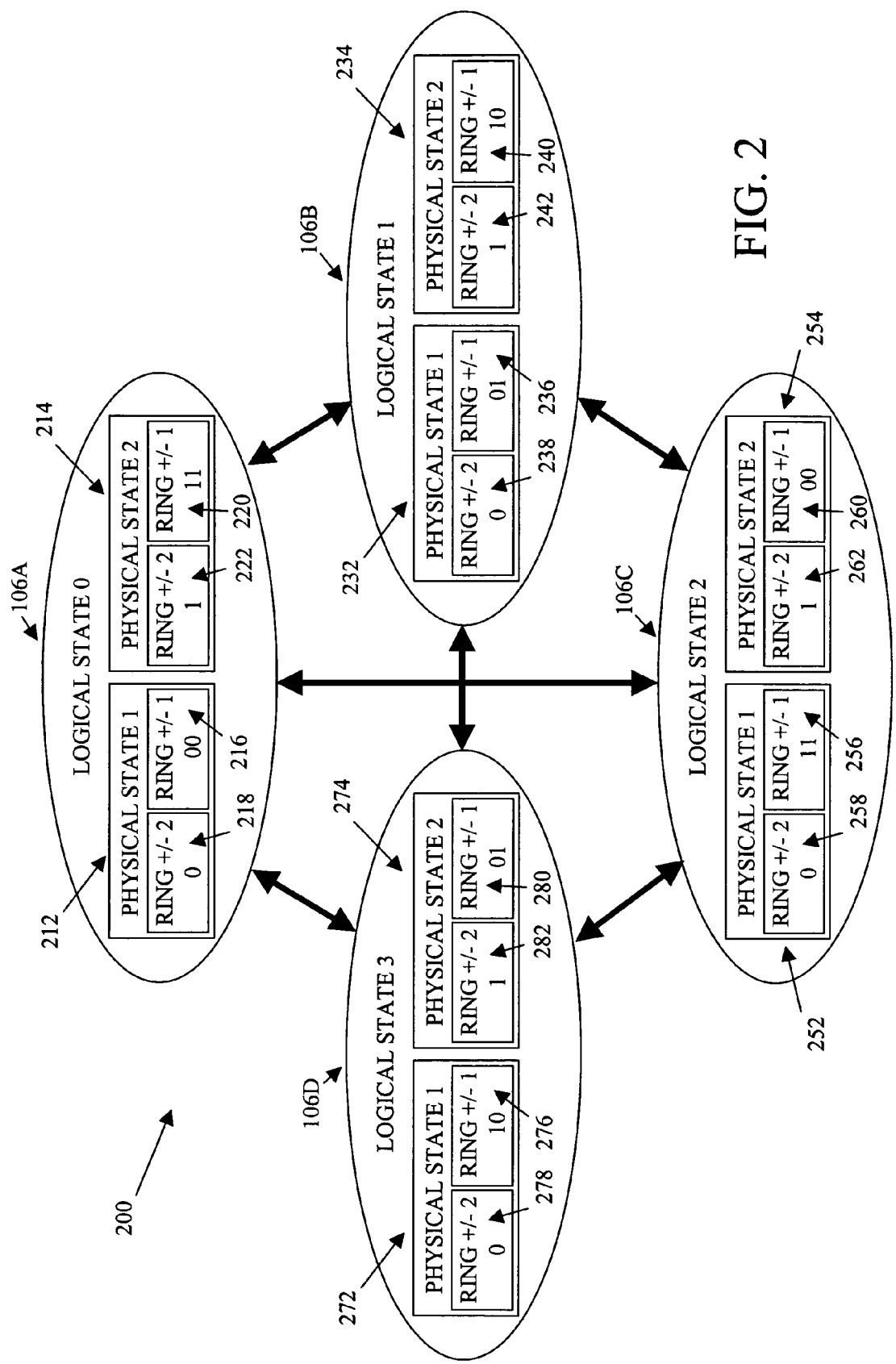
FIG. 2 illustrates a four-state state machine, in accordance with an exemplary embodiment of the present invention.

For purposes of illustration and not limitation, FIG. 2 illustrates a four-state state machine 200, in accordance with an exemplary embodiment of the present invention. State machine 200 is comprised of a plurality of logical states 106: first logical state 106A (logical state 0), second logical state 106B (logical state 1), third logical state 106C (logical state 2) and fourth logical state 106D (logical state 3). Each logical state is associated with a plurality of physical states. For a state machine of N logical states (e.g., logical states 0, 1, 2, ..., N−1), each logical state is associated with at least N/2 physical states to support transitions of $\pm 1, \pm 2, \pm 3, \ldots, \pm N/2$ to any other logical state. Thus, for the example illustrated in FIG. 2, first logical state 106A can be comprised of two physical states: first physical state 212 and second physical state 214. Likewise, second logical state 106B can be comprised of first physical state 232 and second physical state 234, third logical state 106C can be comprised of first physical state 252 and second physical state 254, and fourth logical state 106D can be comprised of first physical state 272 and second physical state 274.

According to exemplary embodiments, each of the plurality of physical states includes a plurality of state rings. Each of the plurality of state rings is comprised of at least one state element. For a state machine of N states, each physical state includes N/2 dedicated state rings. Each state ring P (P=1, 2, 3, ..., N/2) is comprised of at most $\text{Log}_2(N)$ state elements or bits that support the $\pm P$ move within the state ring to any other logical state. In other words, each physical state of the plurality of physical states associated with each logical state is comprised of a plurality of bits of information. According to exemplary embodiments, the bits of information of each physical state can be grouped into sets of state rings, with each state ring comprised of at least one state element or bit. Each of the at least one state element of each of the plurality of state rings comprises a single bit of the plurality of bits of information of each physical state.

Although each state ring P can be comprised of up to $\text{Log}_2(N)$ state elements that support the $\pm P$ move within the state ring to any other logical state, a state ring can include fewer state elements if the state ring number can be divided by two without residue. In such a case, the number of state elements of the state ring is given by $\text{Log}_2(N)-M$, where M is the maximum number of times the state ring number can be divided by two. For example, with a state machine comprised of four states, there are $N/2=2$ state rings for each physical state. For the first state ring (state ring number 1), as 1 cannot be divided by 2 without residue, $\text{Log}_2(8)=3$ state elements are needed for the first state ring. For the second state ring (state ring number 2), as 2 can be divided by 2 once without residue, $Log_2(8)-1=2$ state elements are needed for the second state ring. Thus, a total of three state elements are needed for each physical state of the four-state state machine.

In general, all odd numbered state rings will contain $Log_2(N)$ state elements, as odd state rings are not fully divisible by two. According to exemplary embodiments, the total number of state elements needed for each physical state of each logical state of a state machine having N logical states is less than $(N/2)*Log_2(N)$ but greater than $(N/4)*Log_2(N)$. For example, for a sixteen-state state machine, 25 state elements are needed, while 63 state elements are needed for a 32-state machine.

Thus, for the example illustrated in FIG. 2, first physical state 212 of first logical state 106A is comprised of the value of "000." Reading the value of the physical state from right to left, the two least significant bits comprise first state ring 216, and the most significant bit comprises second state ring 218. Second physical state 214 of first logical state 106A is comprised of the value of "111," with the two least significant bits comprising first ring 220 and the most significant bit comprising second state ring 222. Table 1 lists the logical states, physical states, and associated state rings of the four-state state machine 200 illustrated in FIG. 2. Other representations of the physical states for a four-state state machine are, however, possible.

TABLE 1

Logical, States, Physical States and State Rings for a Four-State State Machine

| LOGICAL STATE | FIRST PHYSICAL STATE | | SECOND PHYSICAL STATE | |
|---|---|---|---|---|
| | SECOND STATE RING | FIRST STATE RING | SECOND STATE RING | FIRST STATE RING |
| 0 | 0 | 00 | 1 | 11 |
| 1 | 0 | 01 | 1 | 10 |
| 2 | 0 | 11 | 1 | 00 |
| 3 | 0 | 10 | 1 | 01 |

According to exemplary, embodiments, each of the plurality of state rings associated with a physical state comprises a Gray code. For example, the state elements that comprise the first state rings associated with the first and second physical states of each logical state of state machine 200 comprise a Gray code, as illustrated in Table 1. Any Gray code can be used for each of the plurality of state rings, such as, for example, any binary-reflected Gray code. The number of bits used for the Gray code of each state ring will depend on the number of state elements used to implement the particular state ring.

Each of the plurality of state rings is associated with a logical distance between logical states. As used herein, a "logical distance" is a distance between two logical states. Referring to the example illustrated in FIG. 2 and Table 1, the logical distance between first logical state 106A and second logical state 106B is one (as the first and second logical states 106A, 106B are contiguous logical states), while the logical distance between first logical state 106A and third logical state 106C is two (as one logical state (either second logical state 106B or fourth logical state 106D) exists between the first and third logical states 106A, 106C). Consequently, to transition from a given logical state to any other logical state, a single state element of the appropriate one of the plurality, of physical states associated with the given logical state is modified in a state ring associated with the logical distance for transitioning to the other logical state.

Using state machine 200 illustrated in FIG. 2 and listed in Table 1 as an example, to transition from first logical state 106A to second logical state 106B, a transition of a logical distance of one is required. For a transition of one, first physical state 212 of first logical state 106A (corresponding to a value of "000") can be modified. As the logical distance between first logical state 106A and second logical state 106B is one, one state element of the first state ring 216 of first physical state 212 can be modified. To transition to second logical state 106B, for example, the least significant bit of first state ring 216 is changed or otherwise flipped, resulting in the value of "001" that corresponds to the first physical state 232 of second logical state 106B. Alternatively, second physical state 214 of first logical state 106A (corresponding to a value of "111") can be used to transition to second logical state 106B. The least significant bit of first ring 220 of second physical state 214 can be modified to transition from "111" to "110," which corresponds to the first ring 240 of second physical state 234 of second logical state 106B. Thus, exemplary embodiments provide for alternative paths to transition between any two logical states in a single move.

In addition, exemplary embodiments of the present invention provide for transitions of logical distances greater than one in a single move. For example, to transition from first logical state 106A to third logical state 106C, a transition of a logical distance of two is required. For a transition of two, second physical state 214 of first logical state 106A (corresponding to a value of "111") can be modified. For example, as the logical distance between first logical state 106A and third logical state 106C is two, the state element of second ring 222 of second physical state 214 can be modified or otherwise flipped, resulting in the value "011." The value of "011" corresponds to the first physical state 252 of third logical state 106C. Alternatively, first physical state 212 of first logical state 106A (corresponding to a value of "000") can be used to transition to third logical state 106C. The state element of second ring 218 of first physical state 212 can be changed or otherwise flipped to transition from "000" to "100." The value of "100" corresponds to the value of second physical state 254 of third logical state 106C.

Similar transitions between second logical state 106B and fourth logical state 106D are possible by modifying the state element in the appropriate second state ring of one of the corresponding physical states. For example, first physical state 232 of second logical state 106B can be transitioned from "001" to "101" by modifying the state element in second ring 238 of first physical state 232. The value of "101" corresponds to second physical state 274 of fourth logical state 106D. Alternatively, second physical state 234 of second logical state 106B can be transitioned from "110" to "010" by modifying the state element in second ring 242 of second physical state 234. The value of "010" corresponds to first physical state 272 of fourth logical state 106D. Consequently, exemplary embodiments of the present invention support transitions of a logical distance up to N/2 for state machines comprised of N states, providing the ability to transition from any logical state to any other logical state within the state machine in a single move by modifying only a single state element.

For purposes of illustration and not limitation, Table 2 lists one example of physical states that can be associated with each logical state of an eight-state state machine to support transitions from any logical state to any other logical state within the state machine. For purposes of simplicity and ease of illustration, Table 2 lists a subset of all possible physical states of the eight-state state machine. Additional representations of the physical states for each logical state of the eight-state state machine can be used to support movement from each physical state to any other physical state. In Table 2, state rings within a physical state are separated by dashes to delineate the four state rings within each physical state, with the least significant state ring corresponding to the first state ring and the most significant state ring corresponding to the fourth state ring (reading a physical state from right to left). As discussed previously, each state ring of each physical state is comprised of a Gray code.

TABLE 2

Logical States, Physical States and State Rings for an Eight-State State Machine

| LOGICAL STATE | FIRST PHYSICAL STATE | SECOND PHYSICAL STATE | THIRD PHYSICAL STATE | FOURTH PHYSICAL STATE |
|---|---|---|---|---|
| 0 | 0-000-00-000 | 0-000-00-000 | 0-000-00-000 | 0-000-00-000 |
| 1 | 0-000-00-001 | 0-000-01-001 | 0-010-00-000 | 0-000-00-001 |
| 2 | 0-000-00-011 | 0-000-01-000 | 0-101-00-000 | 0-000-00-011 |
| 3 | 0-000-00-010 | 0-000-11-001 | 0-001-00-000 | 0-000-00-010 |
| 4 | 0-000-00-110 | 0-000-11-000 | 0-110-00-000 | 1-000-00-000 |
| 5 | 0-000-00-111 | 0-000-10-001 | 0-100-00-000 | 1-000-00-001 |
| 6 | 0-000-00-101 | 0-000-10-000 | 0-011-00-000 | 1-000-00-011 |
| 7 | 0-000-00-100 | 0-000-00-001 | 0-111-00-000 | 1-000-00-010 |

In Table 2, for example, a transition can be made between logical state 1 and logical state 5 by selecting, for example, the physical state of logical state 1 associated with a logical distance of four (e.g., the fourth physical state). Since a transition of a logical distance of four is desired, a bit in the fourth state ring of the fourth physical state of logical state 1 can be modified. Thus, the value the fourth physical state of logical state 1 can be changed from "0-000-00-001" to "1-000-00-001," which corresponds to the value of the fourth physical state of logical state 5. Alternatively, the value of the fourth state ring of the first physical state of logical state 1 can be modified to change the value of the physical state from "0-000-00-001" to "1-000-00-001," which also corresponds to the value of the fourth physical state of logical state 5. A transition from any logical state to any other logical state of the eight-state state machine by modifying only a single state element is, consequently, possible.

For a state machine comprised of eight states, there are N/2=4 state rings for each physical state. For the first state ring (state ring number 1), as 1 cannot be divided by 2 without residue, $\text{Log}_2(8)=3$ state elements are needed for the first state ring. For the second state ring (state ring number 2), as 2 can be divided by 2 once without residue, $\text{Log}_2(8)-1=2$ state elements are needed for the second state ring. For the third state ring (state ring number 3), as 3 cannot be divided by 2 without residue, $\text{Log}_2(8)=3$ state elements are needed for the third state ring. Finally, for the fourth state ring (state ring number 4), as 4 can be divided by 2 twice without residue, $\text{Log}_2(8)-2=1$ state element is needed for the fourth state ring. Thus, a total of nine state elements are needed for each physical state of the eight-state state machine.

To calculate the logical state from the physical state, a polynomial method can be used, such as the following. For each state ring, the Gray code value of the state ring is first converted to a binary value. To convert from Gray code to binary, for example, each of the bits of the Gray code can be labeled as a Gray-coded string G[i], where larger i's represent more significant bits. A binary-coded string B[i] is similarly created. Starting with i representing the bit number of the most significant bit, the most significant bit of G[i] is copied to B[i]. Then, for each smaller i, B[i]=XOR(B[i+1], G[i]) to convert Gray code to binary, where "XOR" represents an EXCLUSIVE-OR operation. Other methods for converting from Gray code to binary can be used. Once converted, the binary-converted value of each state ring is multiplied by the corresponding state ring number. The total sum of all such multiplied rings is taken MODULO (N) to generate the corresponding logical state, as given by Equation (1):

$$\text{Logical State} = (\text{Ring}_1 * 1 + \text{Ring}_2 * 2 + \text{Ring}_3 * 3 + \ldots + \text{Ring}_{N/2} * N/2) \text{ Modulo } (N) \quad (1)$$

In Equation (1), each $\text{Ring}_n$, represents the Gray code value translated to its corresponding binary value for each state ring n.

According to exemplary embodiments, the first state machine 104 of FIG. 1 can include any number N of logical states 106. However, according to an exemplary embodiment of the present invention, the number of logical states N should be of the form $2^n$. If N is not of the form $2^n$, then the next larger number of logical states of the form $2^n$ should be used. For example, a state machine comprised of five states can be implemented by a state machine of eight states (as $8=2^3$).

Referring again to FIG. 1, system 100 can include a second circuit 120 in communication with the first circuit 102. The second circuit 120 is associated with a second clock domain. According to exemplary embodiments, the first clock domain and second clock domain can be different clock domains, although they can be the same clock domain. The second circuit 120 includes a second state machine 122. Second state machine 122 includes a plurality of logical states 106, corresponding to the logical states of first state machine 104. Each of the plurality of logical states 106 of the second state machine 122 is associated with the plurality of physical states, such as the same physical states as those associated with the plurality of logical states 106 of first state machine 104.

According to exemplary embodiments, each of the first and second circuits 102, 120 can include a communication circuit 108, 124, respectively. Communication circuits 108, 124 are configured to communicate the transition from one logical state to another logical state between the first state machine 104 and second state machine 122. Each of first and second circuits 102, 120 can include an encoder/decoder 110, 126, respectively. Encoder/decoder 110, 126 are each configured to translate between a physical state of the plurality of physical states and an associated logical state 106 of the plurality of logical states 106. For example, encoder/decoder 110, 126 can perform such a translation according to Equation (1). According to exemplary embodiments, physical states are communicated between circuits, such as between first and second circuits 102, 120. For example, encoder/decoder 110 of first circuit 102 can translate a logical state (e.g., the transitioned logical state) to an associated physical state. Communication circuit 108 can transmit the physical state to communication circuit 124 of second circuit 120. Encoder/decoder 126 can translate the physical state back to the corresponding logical state for use in the respective clock domain of the second circuit 120. Communication from second circuit 120 to first circuit 102, or between any other such circuits, is also possible. To synchronize the communication of the transition from one logical state to another logical state between the first state machine 104 and the second state machine 122, the system 100 can include a synchronizer 112 in communication with the first circuit 102 and the second circuit 120. For example, synchronizer 112 can be used to synchronize communications from the first circuit 102 associated with the first clock domain to the second clock domain associated with the second circuit 120. The second circuit 122 can be in communication with the first circuit 102 via a communication bus 114, such as, for example, a multi-bit communication bus or the like.

First circuit 102 and second circuit 120 can each be formed on, for example, a monolithic substrate. Alternatively, each element, or any combination thereof, of each of first and second circuits 102, 120 can be any suitable type of electrical or electronic component or device that is capable of performing the functions associated with the respective element. According to such an alternative exemplary embodiment, each component or device can be in communication with another component or device using any appropriate type of electrical connection that is capable of communicating electrical information.

Those of ordinary skilled will recognize that system 100 can include any additional electrical or electronic components, devices or elements in any suitable combination that can be used for communicating information signals, depending upon the nature and type of information signals to be communicated and the environment in which the system 100 is to be used. For example, the additional components can be formed on the same monolithic substrate as either first circuit 102 or second circuit 120. The system 100 can include and/or be connected to additional components, such as, for example, any type of processor, including any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM), or the like. The system 100 can also include or be connected to any type of computer memory or any other type of electronic storage medium that is located either internally or externally to the processor such as, for example, read-only memory (ROM), random access memory (RAM), cache memory, compact disc read-only memory (CDROM), electro-optical memory, magneto-optical memory, or the like. The processor and memory can be used, for example, to perform additional processing on information signals that have been or are to be communicated by system 100, for controlling any part of the system 100, or the like.

Figure 3:
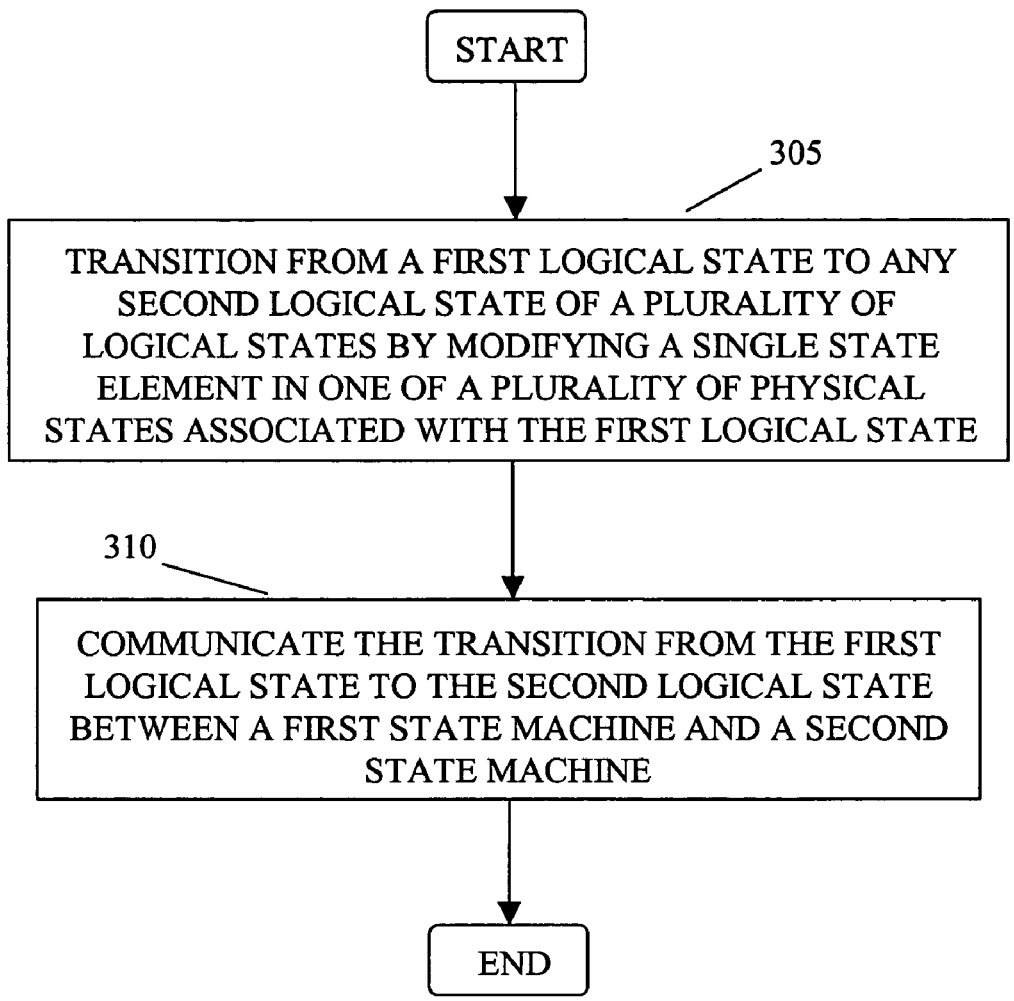
FIG. 3 is a flowchart illustrating steps for communicating information, in accordance with an exemplary embodiment of the present invention.

FIG. 3 is a flowchart illustrating steps for communicating information, in accordance with an exemplary embodiment of the present invention. In step 305, a transition from a first logical state to any second logical state of a plurality of logical states is made by modifying a single state element in one of a plurality of physical states associated with the first logical state. In step 310, the transition from the first logical state to the second logical state is communicated between a first state machine and a second state machine. According to exemplary embodiments, each of the plurality of physical states includes of a plurality of state rings. Each of the plurality of state rings is comprised of at least one state element. Each state ring of the plurality of state rings is associated with a logical distance between logical states. Each physical state of the plurality of physical states is comprised of a plurality of bits of information. Each of the at least one state element of each of the plurality of state rings comprises a single bit of the plurality of bits of information of each physical state of the plurality of physical states. For example, each of the plurality of state rings comprises a Gray code. According to exemplary embodiments, the first state machine is associated with a first clock domain and the second state machine is associate with a second clock domain. For example, the first clock domain and the second clock domain can be different clock domains.

Figure 4:
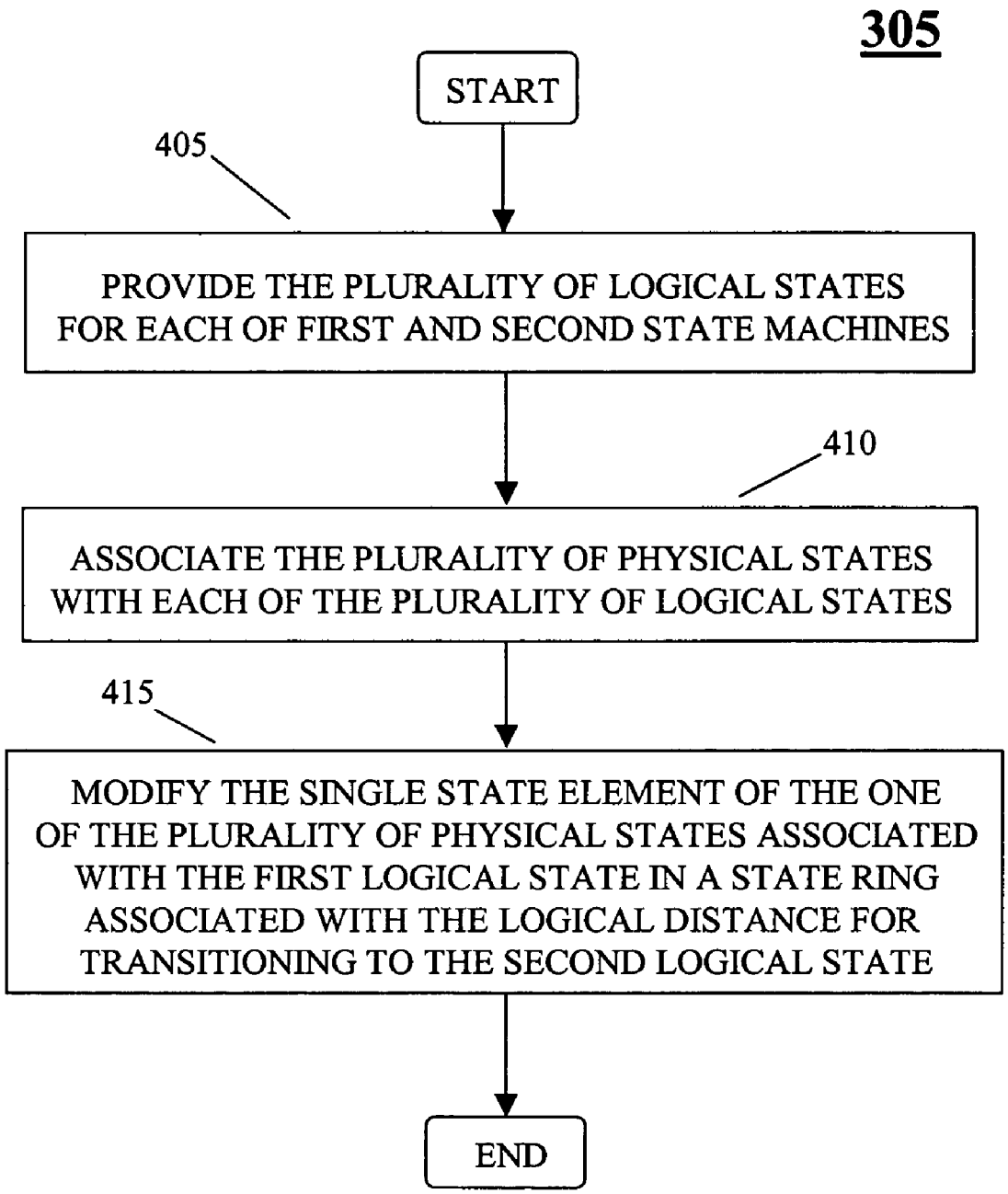
FIG. 4 is a flowchart illustrating steps for transitioning from a first logical state to any second logical state of a plurality of logical states, in accordance with an exemplary embodiment of the present invention.

FIG. 4 is a flowchart illustrating steps for step 305 of FIG. 3 of transitioning from a first logical state to any second logical state, in accordance with an exemplary embodiment of the present invention. In step 405, the plurality of logical states are provided for each of the first and second state machines. In step 410, a plurality of physical states are associated with each of the plurality of logical states. In step 415, the single state element of the one of the plurality of physical states associated with the first logical state is modified in a state ring associated with the logical distance for transitioning to the second logical state.

Figure 5:
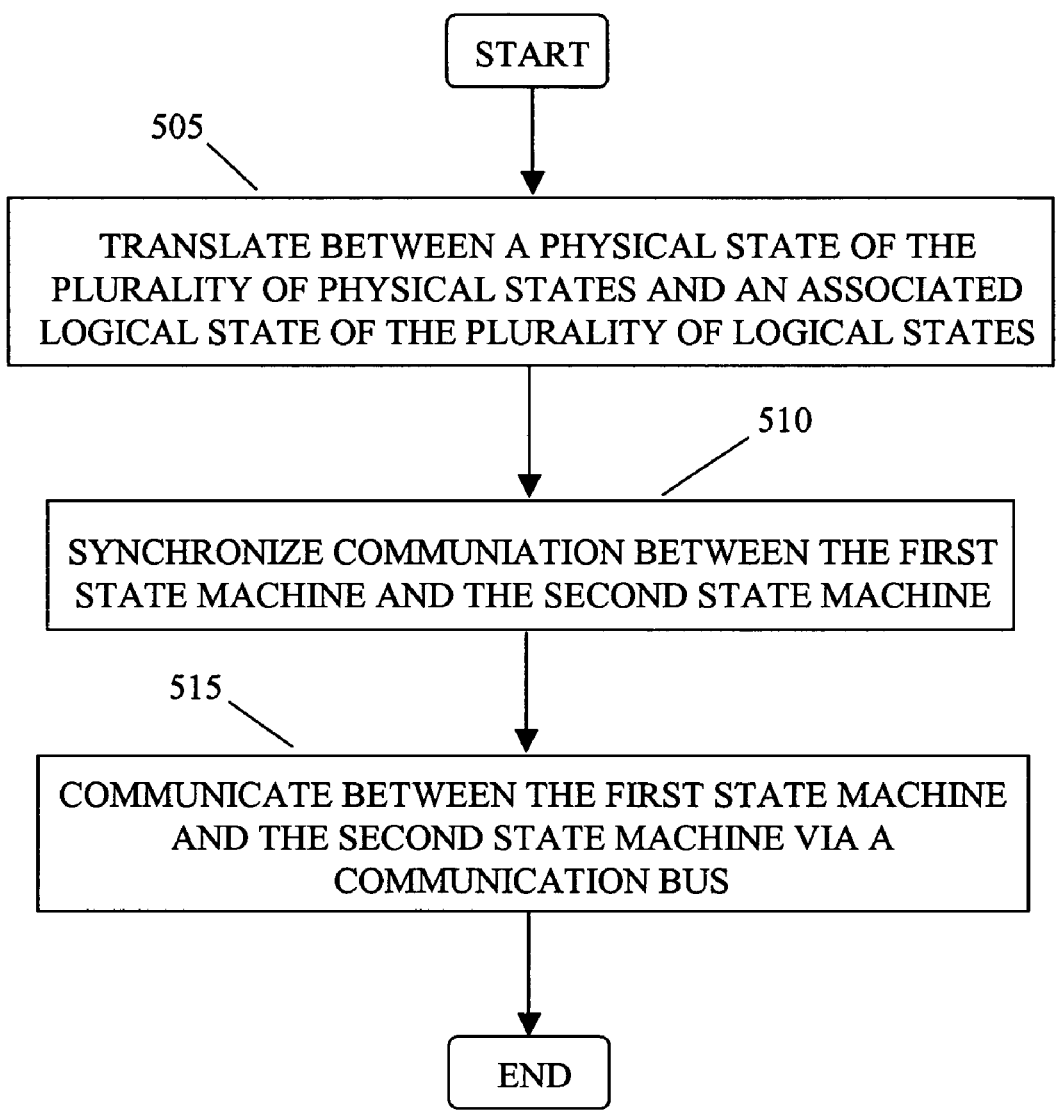
FIG. 5 is a flowchart illustrating steps for communicating a transition from a first logical state to any second logical state of a plurality of logical states, in accordance with an exemplary embodiment of the present invention.

FIG. 5 is a flowchart illustrating steps for step 310 of FIG. 3 of communicating the transition from the first logical state to the second logical state, in accordance with an exemplary embodiment of the present invention. In step 505, a translation is performed between a physical state of the plurality of physical states and an associated logical state of the plurality of logical states. For example, Equation (1) can be used to perform the translation. In step 510, communication between the first state machine and the second state machine is synchronized. In step 515, communication between the first state machine and the second state machine can be performed via a communication bus.

Figure 6:
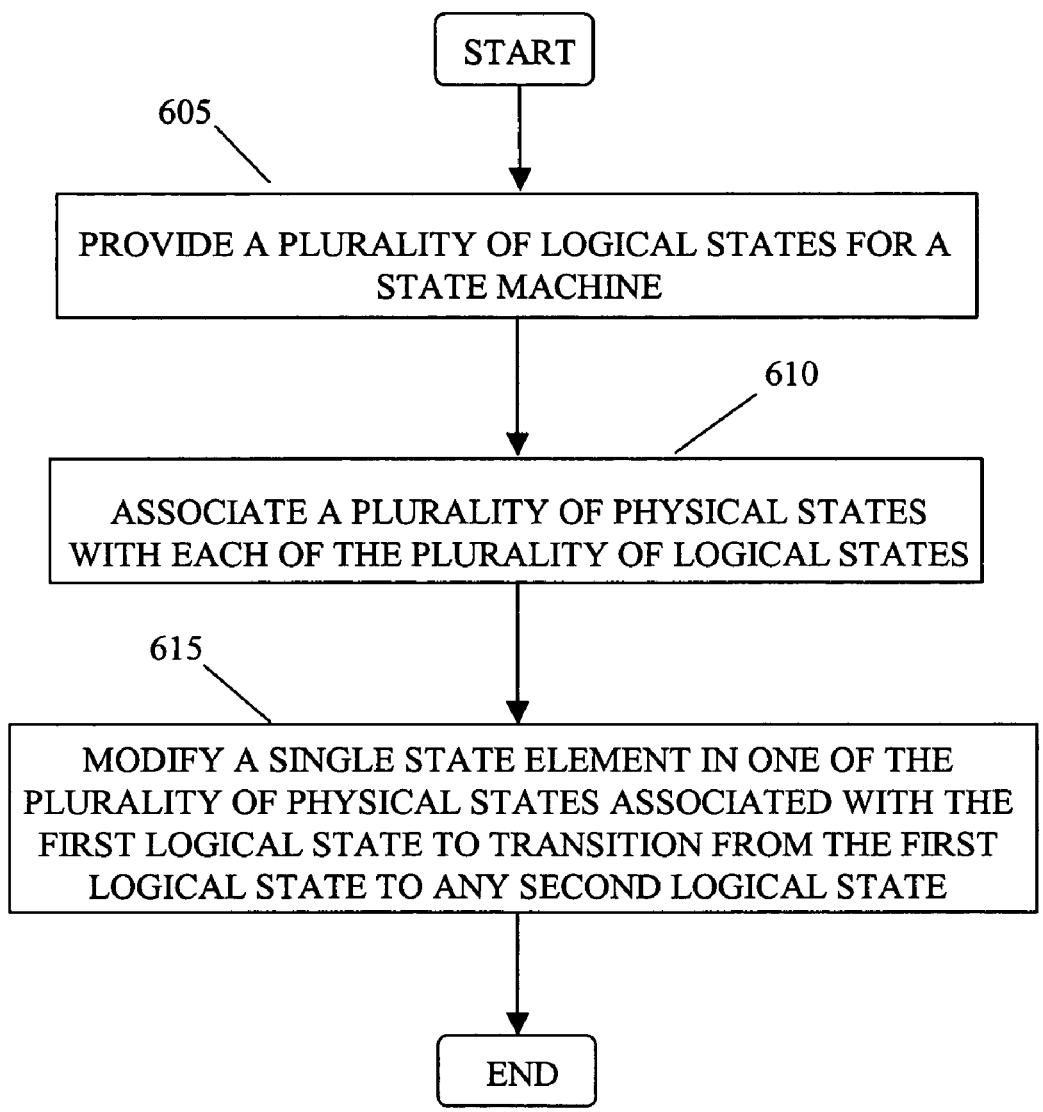
FIG. 6 is a flowchart illustrating steps for transitioning from a first logical state to any second logical state of a plurality of logical states, in accordance with an exemplary embodiment of the present invention.

FIG. 6 is a flowchart illustrating steps for transitioning from a first logical state to any second logical state of a plurality of logical states, in accordance with an exemplary embodiment of the present invention. In step 605, the plurality of logical states is provided for a state machine. In step 610, a plurality of physical states is associated with each of the plurality of logical states. In step 615, a single state element in one of the plurality of physical states associated with the first logical state is modified to transition from the first logical state to any second logical state.

According to exemplary embodiments, each of the plurality of physical states includes of a plurality of state rings. Each of the plurality of state rings is comprised of at least one state element. Each state ring of the plurality of state rings is associated with a logical distance between logical states. Each physical state of the plurality of physical states is comprised of a plurality of bits of information. Each of the at least one state element of each of the plurality of state rings comprises a single bit of the plurality of bits of information of each physical state of the plurality of physical states. According to an exemplary embodiment, each of the plurality of state rings comprises a Gray code.

Figure 7:
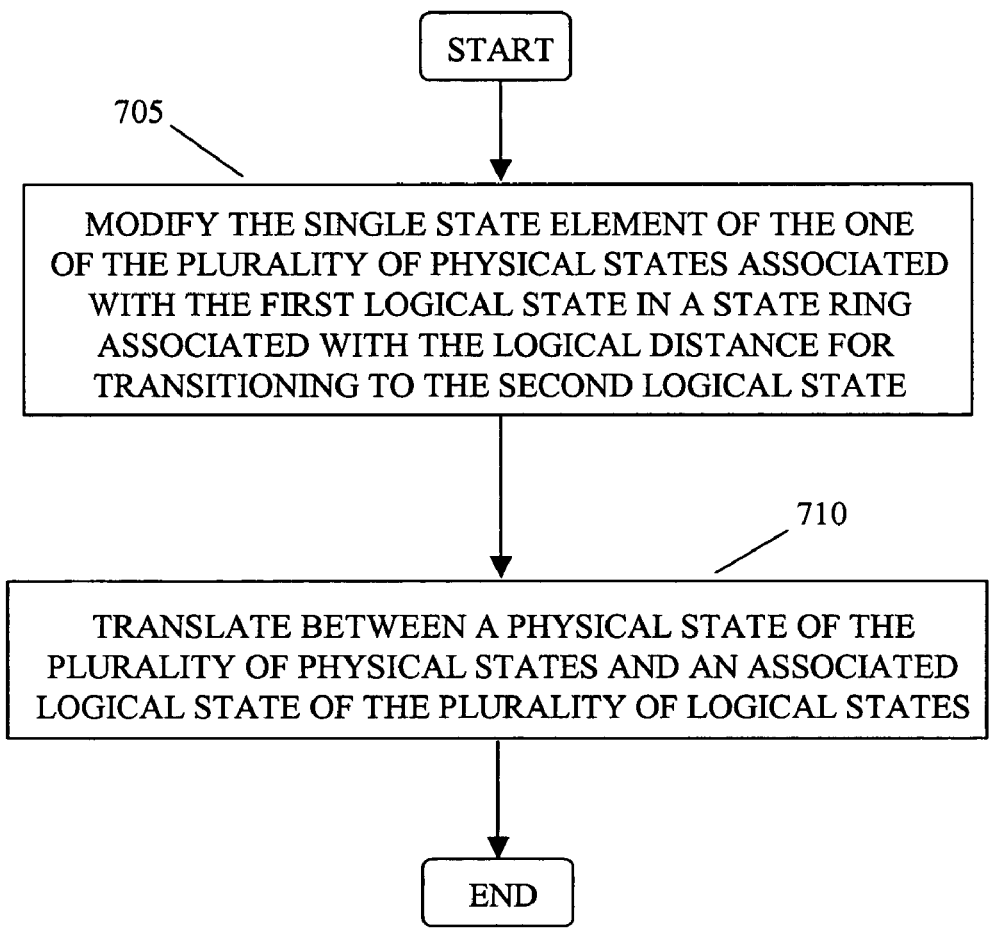
FIG. 7 is a flowchart illustrating steps for modifying the single state element to transition from a first logical state to any second logical state, in accordance with an exemplary, embodiment of the present invention.

FIG. 7 is a flowchart illustrating steps for step 615 of FIG. 6 of modifying the single state element to transition from a first logical state to any second logical state, in accordance with an exemplary embodiment of the present invention. In step 705, the single state element of the one of the plurality of physical states associated with the first logical state is modified in a state ring associated with the logical distance for transitioning to the second logical state. In step 710, a translation is performed between a physical state of the plurality of physical states and an associated logical state of the plurality of logical states. For example, Equation (1) can be used to perform the translation.

Any or all of the steps of a computer program as illustrated in FIGS. 3-7 can be performed by a computer program embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system; apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Exemplary embodiments of the present invention can be used in any electrical or electronic device or system that can use a state machine(s) to process and/or communicate information, such as, for example, to move from one logical state to any other logical state in a single move by modifying a single state element. For example, exemplary embodiments can be used in counters to increment/decrement the counter by values greater than ±1. In addition, exemplary embodiments can be used in Ethernet controllers to support transitions of greater than ±1 between logical states. For example, a counter or an Ethernet controller can be comprised of first circuit 102 of FIG. 1, or any combination of the features thereof. Alternatively, the system 100 of FIG. 1 can comprise a data interface for transferring information between circuits in distinct clock domains. Other uses of exemplary embodiments of the present invention are possible.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A system for communicating information, comprising: a first circuit, wherein the first circuit is associated with a first clock domain, wherein the first circuit includes a first state machine, and wherein the first state machine comprises: a plurality of logical states, wherein each of the plurality of logical states is associated with a plurality of physical states, each of the plurality of physical states including a plurality of bits, and wherein a single bit in one of the plurality of physical states associated with a first logical state is modified to transition from the first logical state to any of others of the plurality of logical states.

2. The system of claim 1, wherein each of the plurality of physical states includes a plurality of state rings, and wherein each of the plurality of state rings is comprised of at least one bit.

3. The system of claim 2, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

4. The system of claim 2, wherein each of the plurality of state rings comprises a Gray code.

5. The system of claim 1, comprising:
a second circuit in communication with the first circuit,
wherein the second circuit is associated with a second clock domain,
wherein the second circuit includes a second state machine, and
wherein the second state machine comprises:
the plurality of logical states,
wherein each of the plurality of logical states is associated with the plurality of physical states.

6. The system of claim 5, wherein each of the first and second circuits comprises:
a communication circuit for communicating the transition from the first logical state to the others of the plurality of logical states between the first state machine and the second state machine.

7. The system of claim 6, wherein the communication circuit of each of the first and second circuits includes an encoder/decoder,
wherein each encoder/decoder is configured to translate between a physical state of the plurality of physical states and an associated logical state of the plurality of logical states.

8. The system of claim 6, comprising:
a synchronizer in communication with the first circuit and the second circuit.

9. The system of claim 5, wherein the first clock domain and the second clock domain are different clock domains.

10. The system of claim 5, wherein the second circuit is in communication with the first circuit via a multi-bit communication bus.

11. The system of claim 1, wherein an Ethernet controller comprises the system.

12. An Ethernet controller, comprising: a state machine, wherein the state machine includes a plurality of logical states, wherein each of the plurality of logical states is associated with a plurality of physical states, each of the plurality of physical states including a plurality of bits, and wherein the state machine is configured to modify a single bit in one of the plurality of physical states associated with a first logical state to transition from the first logical state to any of others of the plurality of logical states; and circuit logic for translating between a physical state of the plurality of physical states and an associated logical state of the plurality of logical states.

13. The Ethernet controller of claim 12, wherein each of the plurality of physical states includes a plurality of state rings, and wherein each of the plurality of state rings is comprised of at least one bit.

14. The Ethernet controller of claim 13, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

15. The Ethernet controller of claim 14, wherein each of the plurality of state rings comprises a Gray code.

16. The Ethernet controller of claim 13, wherein the circuit logic includes a communication circuit for communicating the transition from the first logical state to the others of the plurality of logical states.

17. A data interface for transferring information between circuits operating in distinct clock domains, comprising: a first state machine, wherein the first state machine is associated with a first clock domain; a second state machine, wherein the second state machine is associated with a second clock domain, wherein each of the first and second state machines includes a plurality of logical states, wherein each of the plurality of logical states is associated with a plurality of physical states, each of the plurality of physical states including a plurality of bits, and wherein each of the first and second state machines is configured to modify a single bit in one of the plurality of physical states associated with a first logical state to transition from the first logical state to any of others of the plurality of logical states; a communication interface, wherein the first state machine is in communication with the second state machine via the communication interface; and a communication circuit for communicating the transition from the first logical state to the others of the plurality of logical states between the first state machine and the second state machine.

18. The data interface of claim 17, wherein each of the plurality of physical states includes a plurality of state rings, and wherein each of the plurality of state rings is comprised of at least one bit.

19. The data interface of claim 18, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

20. The data interface of claim 18, wherein each of the plurality of state rings comprises a Gray code.

21. The data interface of claim 17, wherein the communication circuit comprises:
an encoder/decoder configured to translate between a physical state of the plurality of physical states and an associated logical state of the plurality of logical states.

22. The data interface of claim 17, wherein the communication interface comprises:
a synchronizer for synchronizing communication of the transition from the first logical state to the others of the plurality of logical states between the first state machine and the second state machine.

23. The data interface of claim 17, wherein the first clock domain and the second clock domain are different clock domains.

24. The data interface of claim 17, wherein the communication interface comprises a multi-bit communication bus.

25. A system for communicating information, comprising: a first circuit means, wherein the first circuit means is associated with a first clock domain, wherein the first circuit means includes a first means for managing logical states, wherein the first means for managing logical states comprises: a plurality of logical states, wherein each of the plurality of logical states is associated with a plurality of physical states, each of the plurality of physical states including a plurality of bits, and wherein the first means for managing logical states is configured to modify a single bit in one of the plurality of physical states associated with a first logical state to transition from the first logical state to any of others of the plurality of logical states.

26. The system of claim 25, wherein each of the plurality of physical states includes a plurality of state rings, and wherein each of the plurality of state rings is comprised of at least one bit.

27. The system of claim 26, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

28. The system of claim 26, wherein each of the plurality of state rings comprises a Gray code.

29. The system of claim 25, comprising:
a second circuit means in communication with the first circuit means,
wherein the second circuit means is associated with a second clock domain,
wherein the second circuit means includes a second means for managing logical states, and
wherein the first means for managing logical states comprises: the plurality of logical states,
wherein each of the plurality of logical states is associated with the plurality, of physical states.

30. The system of claim 29, wherein each of the first and second circuit means comprises:
means for communicating the transition from the first logical state to the others of the plurality of logical states between the first means for managing logical states and the second means for managing logical states.

31. The system of claim 30, wherein the means for communicating of each of the first and second circuit means includes a means for encoding/decoding,
wherein each means for encoding/decoding is configured to translate between a physical state of the plurality of physical states and an associated logical state of the plurality of logical states.

32. The system of claim 30, comprising:
means for synchronizing communication between the first circuit means and the second circuit means,
wherein the means for synchronizing is in communication with the first circuit means and the second circuit means.

33. The system of claim 29, wherein the first clock domain and the second clock domain are different clock domains.

34. The system of claim 29, wherein the second circuit means is in communication with the first circuit means via a multi-bit communication bus means.

35. The system of claim 25, wherein an Ethernet controller comprises the system.

36. An Ethernet controller, comprising: means for managing logical states, wherein the means for managing logical states includes a plurality of logical states, wherein each of the plurality of logical states is associated with a plurality of physical states, each of the plurality of physical states including a plurality of bits, and wherein the means for managing logical states is configured to modify a single bit in one of the plurality of physical states associated with a first logical state to transition from the first logical state to any of others of the plurality of logical states; and means for translating between a physical state of the plurality of physical states and an associated logical state of the plurality of logical states.

37. The Ethernet controller of claim 36, wherein each of the plurality of physical states includes a plurality of state rings, and wherein each of the plurality of state rings is comprised of at least one bit.

38. The Ethernet controller of claim 37, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

39. The Ethernet controller of claim 37, wherein each of the plurality of state rings comprises a Gray code.

40. A system for transferring data between circuits operating in distinct clock domains, comprising: a first means for managing logical states; a second means for managing logical states, wherein each of the first and second means for managing logical states includes a plurality of logical states, wherein each of the plurality of logical states is associated with a plurality of physical states, each of the plurality of physical states including a plurality of bits, and wherein each of the first and second means for managing logical states is configured to modify a single bit in one of the plurality of physical states associated with a first logical state to transition from the first logical state to any of others of the plurality of logical states; means for transferring information, wherein the first means for managing logical states is in communication with the second means for managing logical states via the means for transferring information; and means for communicating a transition from the first logical state to the others of the plurality of logical states between the first means for managing logical states and the second means for managing logical states.

41. The system of claim 40, wherein each of the plurality of physical states includes a plurality of state rings, and wherein each of the plurality of state rings is comprised of at least one bit.

42. The system of claim 41, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

43. The system of claim 41, wherein each of the plurality of state rings comprises a Gray code.

44. The system of claim 40, wherein the means for communicating a transition comprises:
    means for translating between a physical state of the plurality of physical states and an associated logical state of the plurality of logical states.

45. The system of claim 40, wherein the means for transferring information comprises:
    means for synchronizing communication of the transition from the first logical state to the others of the plurality of logical states between the first means for managing states and the second means for managing states.

46. The data interface of claim 40, wherein the first means for managing states is associated with a first clock domain and the second means for managing states is associated with a second clock domain, and
    wherein the first clock domain and the second clock domain are different clock domains.

47. A method of communicating information, comprising the steps of: transitioning from a first logical state to any of others of a plurality of logical states that include the first logical state by modifying a single bit in one of a plurality of physical states associated with the first logical state, each of the plurality of physical states including a plurality of bits; and communicating the transition from the first logical state to the others of the plurality of logical states between a first state machine and a second state machine.

48. The method of claim 47, wherein the step of transitioning comprises the steps of:
    providing the plurality of logical states for each of the first and second state machines; and
    associating a plurality of physical states with each of the plurality of logical states.

49. The method of claim 47, wherein each of the plurality of physical states includes a plurality of state rings, and wherein each of the plurality of state rings is comprised of at least one bit.

50. The method of claim 49, wherein each state ring of the plurality of state rings is associated with a logical distance between logical states, and wherein the step of transitioning comprises the step of: modifying the single bit of the one of the plurality of physical states associated with the first logical state in a state ring associated with the logical distance for transitioning to the others of the plurality of logical states.

51. The method of claim 49, wherein each of the plurality of state rings comprises a Gray code.

52. The method of claim 47, wherein the step of communicating comprises the step of:
    translating between a physical state of the plurality of physical states and an associated logical state of the plurality of logical states.

53. The method of claim 47, wherein the step of communicating comprises the step of:
    synchronizing communication between the first state machine and the second state machine.

54. The method of claim 47, wherein the step of communicating comprises the step of:
    communicating between the first state machine and the second state machine via a communication bus.

55. The method of claim 47, wherein the first state machine is associated with a first clock domain and the second state machine is associate with a second clock domain.

56. The method of claim 55, wherein the first clock domain and the second clock domain are different clock domains.

57. A method for transitioning from a first logical state to any second logical state of a plurality of logical states, comprising the steps of: providing the plurality of logical states for a state machine; associating a plurality of physical states with each of the plurality of logical states, each of the plurality of physical states including a plurality of bits; and modifying a single bit in one of the plurality of physical states associated with the first logical state to transition from the first logical state to any of others of the plurality of logical states.

58. The method of claim 57, wherein each of the plurality of physical states includes a plurality of state rings, and wherein each of the plurality of state rings is comprised of at least one bit.

59. The method of claim 58, wherein each state ring of the plurality of state rings is associated with a logical distance between logical states, and wherein the step of modifying comprises the step of: modifying the single bit of the one of the plurality of physical states associated with the first logical state in a state ring associated with the logical distance for transitioning to the others of the plurality of logical states.

60. The method of claim 58, wherein each of the plurality of state rings comprises a Gray code.

61. The method of claim 57, wherein the step of modifying comprises the step of:
    translating between a physical state of the plurality of physical states and an associated logical state of the plurality of logical states.

62. A computer program stored on a computer-readable medium and executable by a computer for communicating information, wherein the computer program performs the steps of: transitioning from a first logical state to any of others of a plurality of logical states that include the first logical state by modifying a single bit in one of a plurality of physical states associated with the first logical state, each of the plurality of physical states including a plurality of bits; and communicating the transition from the first logical state to the others of the plurality of logical states between a first state machine and a second state machine.

63. The computer program of claim 62, wherein for the step of transitioning, the computer program performs the steps of:
providing the plurality of logical states for each of the first and second state machines; and
associating a plurality of physical states with each of the plurality of logical states.

64. The computer program of claim 62, wherein each of the plurality of physical states includes a plurality of state rings, and wherein each of the plurality of state rings is comprised of at least one bit.

65. The computer program of claim 64, wherein each state ring of the plurality of state rings is associated with a logical distance between logical states, and wherein for the step of transitioning, the computer program performs the step of: modifying the single bit of the one of the plurality of physical states associated with the first logical state in a state ring associated with the logical distance for transitioning to the others of the plurality of logical states.

66. The computer program of claim 64, wherein each of the plurality of state rings comprises a Gray code.

67. The computer program of claim 62, wherein for the step of communicating, the computer program performs the step of:
translating between a physical state of the plurality of physical states and an associated logical state of the plurality of logical states.

68. The computer program of claim 62, wherein for the step of communicating, the computer program performs the step of:
synchronizing communication between the first state machine and the second state machine.

69. The computer program of claim 62, wherein for the step of communicating, the computer program performs the step of:
communicating between the first state machine and the second state machine via a communication bus.

70. The computer program of claim 62, wherein the first state machine is associated with a first clock domain and the second state machine is associate with a second clock domain.

71. The computer program of claim 70, wherein the first clock domain and the second clock domain are different clock domains.

72. A computer program stored on a computer-readable medium and executable by a computer for transitioning from a first logical state to any second logical state of a plurality of logical states, wherein the computer program performs the steps of: providing the plurality of logical states for a state machine; associating a plurality of physical states with each of the plurality of logical states, each of the plurality of physical states including a plurality of bits; and modifying a single bit in one of the plurality of physical states associated with the first logical state to transition from the first logical state to any of others of the plurality of logical states.

73. The computer program of claim 72, wherein each of the plurality of physical states includes a plurality of state rings, and wherein each of the plurality of state rings is comprised of at least one bit.

74. The computer program of claim 73, wherein each state ring of the plurality of state rings is associated with a logical distance between logical states, and wherein for the step of modifying, the computer program performs the step of: modifying the single bit of the one of the plurality of physical states associated with the first logical state in a state ring associated with the logical distance for transitioning to the others of the plurality of logical states.

75. The computer program of claim 73, wherein each of the plurality of state rings comprises a Gray code.

76. The computer program of claim 72, wherein for the step of modifying, the computer program performs the step of:
translating between a physical state of the plurality of physical states and an associated logical state of the plurality of logical states.

77. A system for communicating information, comprising: a first circuit, wherein the first circuit is associated with a first clock domain, wherein the first circuit includes a first state machine, and wherein the first state machine comprises: a plurality of logical states, wherein each of the plurality of logical states is associated with a plurality of physical states, each of the plurality of physical states including a plurality of bits; a second circuit in communication with the first circuit, wherein the second circuit is associated with a second clock domain, wherein the first clock domain and the second clock domain are different clock domains, wherein the second circuit includes a second state machine, wherein the second state machine comprises: the plurality of logical states, wherein each of the plurality of logical states is associated with the plurality of physical states, wherein each of the plurality of physical states includes a plurality of state rings, wherein each of the plurality of state rings is comprised of at least one bit, wherein each of the plurality of state rings comprises a Gray code, and wherein a single bit in one of the plurality of physical states associated with a first logical state is modified to transition from the first logical state to any of others of the plurality of logical states; a communication circuit, wherein the communication circuit is configured to communicate the transition from the first logical state to the others of the plurality of logical states between the first state machine and the second state machine, wherein the communication circuit comprises: an encoder/decoder, wherein the encoder/decoder is configured to translate between a physical state of the plurality of physical states and an associated logical state of the plurality of logical states.

78. The system of claim 77, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

79. The system of claim 77, comprising:
a synchronizer in communication with the first circuit and the second circuit.

80. The system of claim 77, wherein the second circuit is in communication with the first circuit via a multi-bit communication bus.

81. A system for communicating information, comprising: a first circuit means, wherein the first circuit means is associated with a first clock domain, wherein the first circuit means includes a first state machine means, and wherein the first state machine means comprises: a plurality of logical states, wherein each of the plurality of logical states is associated with a plurality of physical states, each of the plurality of physical states including a plurality of bits; a second circuit means in communication with the first circuit means, wherein the second circuit means is associated with a second clock domain, wherein the first clock domain and the second clock domain are different clock domains, wherein the second circuit means includes a second state machine means, wherein the second state machine means comprises: the plurality of logical states, wherein each of the plurality of logical states is associated with the plurality of physical states, wherein each of the plurality of physical states includes of a plurality of state rings, wherein each of the plurality of state rings is comprised of at least one state element, wherein each of the plurality of state rings comprises a Gray code, and wherein a single bit in one of the plurality of physical states associated with a first logical state is modified to transition from the first logical state to any of others of the plurality of logical states; a communication circuit means, wherein the communication circuit means is configured to communicate the transition from the first logical state to the others of the plurality of logical states between the first state machine means and the second state machine means, wherein the communication circuit means comprises: an encoder/decoder means, wherein the encoder/decoder means is configured to translate between a physical state of the plurality of physical states and an associated logical state of the plurality of logical states.

82. The system of claim 81, wherein each state ring of the plurality of state rings is associated with a logical distance between logical states, and wherein the single bit of the one of the plurality of physical states associated with the first logical state is modified in a state ring associated with the logical distance for transitioning to the others of the plurality of logical states.

83. The system of claim 81, comprising:
a synchronizer means in communication with the first circuit means and the second circuit means.

84. The system of claim 81, wherein the second circuit means is in communication with the first circuit means via a multi-bit communication bus means.

\* \* \* \* \*